(12) United States Patent
Takaki

(10) Patent No.: US 6,448,834 B2
(45) Date of Patent: Sep. 10, 2002

(54) CLOCK GENERATING DEVICE

(75) Inventor: Kouichi Takaki, Tokyo (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 09/802,225

(22) Filed: Mar. 8, 2001

(30) Foreign Application Priority Data

Mar. 10, 2000 (JP) ...................................... 2000-066805

(51) Int. Cl.$^7$ ................................................ H03K 3/00
(52) U.S. Cl. ...................... 327/291; 327/298; 327/299; 327/269
(58) Field of Search ................................. 327/291, 292, 327/293, 294, 298, 299, 231, 248, 249, 269, 270, 276, 277, 284

(56) References Cited

U.S. PATENT DOCUMENTS

| | | | | |
|---|---|---|---|---|
| 4,626,716 A | * | 12/1986 | Miki | ........................... 327/270 |
| 5,245,637 A | * | 9/1993 | Gersbach et al. | ........... 327/231 |
| 5,463,337 A | * | 10/1995 | Leonowich | .................. 327/261 |
| 5,719,515 A | * | 2/1998 | Danger | ........................ 327/270 |
| 6,127,858 A | * | 10/2000 | Stinson et al. | .............. 327/276 |

* cited by examiner

*Primary Examiner*—Kenneth B. Wells
*Assistant Examiner*—An T. Luu
(74) *Attorney, Agent, or Firm*—Frishauf, Holtz, Goodman & Chick, P.C.

(57) ABSTRACT

A clock generator is provided which controls a leading edge and a trailing edge of a clock to come to an arbitrary position for every clock pulse. A base clock pulse is generated, and then at least first and second clock pulses are generated by delaying the base clock pulse, wherein phases of each of the base clock pulse, the first clock pulse, and the second clock pulse are different from each other. The first clock pulse and the second clock pulse are selected in order so as to synthesize an output clock pulse from the first clock pulse and the second clock pulse within one cycle period of the output clock pulse, so that a leading edge portion of the output clock pulse comprises the first clock pulse and a trailing edge portion of the output clock pulse comprises the second clock pulse within the one cycle period of the output clock pulse.

29 Claims, 13 Drawing Sheets

FIG. 2(a) BASIC CLOCK
FIG. 2(b) DL19
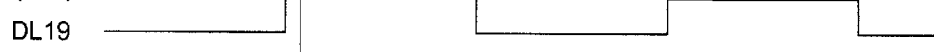
FIG. 2(c) DL20
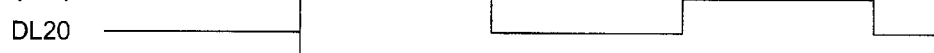
FIG. 2(d) DL21
FIG. 2(e) DL22
FIG. 2(f) DL23
FIG. 2(g) DL24
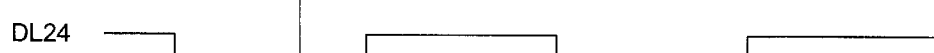
FIG. 2(h) DL25
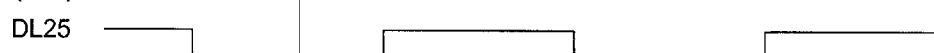
FIG. 2(i) DL46
FIG. 2(j) DL47
FIG. 2(k) DL48
FIG. 2(l) DL49
FIG. 2(m) DL50
FIG. 2(n) DL51

CLOCK GENERATING DEVICE

BACKGROUND OF THE INVENTION

This invention relates to a clock generating device, a circuit board, an image forming apparatus, and the method of generating a clock, and in particular, to the control of the rise and fall of a clock pulse at an arbitrary timing.

A clock is necessary for the circuit operation in various kinds of digital circuits. This clock is generated by a clock generating circuit of any one of various types.

In a clock generating circuit which has been heretofore put in practice, the cycle (frequency) of a clock is constant, and the positions of the leading edge and the trailing edge are fixed.

Regarding the above-mentioned clock, it has become a problem that an electromagnetic wave having its peak intensity at the clock frequency is radiated to the outside of the apparatus. Therefore, it has been developed a technology to lower the level of the peak portion by broadening the frequency band of the radiated electromagnetic wave through the frequency modulation of the clock (clock dithering).

For the above-mentioned, an IC to make frequency modulation of a clock by a PLL circuit has been put on the market.

Incidentally, by carrying out the above-mentioned clock dithering, the leading edge and trailing edge of a clock are made advanced or delayed as compared to a conventional clock which is not subjected to clock dithering. This is a phenomenon called clock slip. This clock slip is difficult to precisely control or to precisely measure. For this reason, it has been necessary to avoid a mixed use of a clock having been subjected to clock dithering and a clock having not been subjected to it because they have different phases and polarities from each other.

SUMMARY OF THE INVENTION

This invention has been made in order to solve the above-mentioned problem, and it is an object of the invention to provide a clock generating device, a circuit board, an image forming apparatus, and the method of generating a clock which are capable of controlling the leading edge and trailing edge of a clock to come to an arbitrary position for every clock pulse.

The above-mentioned problem can be solved by any one of the following means.

(1) A clock generating device comprising a clock generating section for generating a plurality of clocks having different phases respectively, and a selecting section for selecting some one out of said plurality of clocks to output it and switching the clock to a different one to output it within one cycle of the clock to be outputted.

(2) A clock generating device comprising a clock generating section for generating a plurality of clocks having different phases respectively, and a selecting section for combining at least two clocks having different phases respectively out of said plurality of clocks to output the composite one within one cycle of the clock to be outputted.

(3) A clock generating device comprising a clock generating section for generating a plurality of clocks having different phases respectively, and a selecting section for selecting some one out of said plurality of clocks to output it, wherein it is judged which one of the clocks is to be selected within one cycle of the clock to be outputted from said selecting section.

(4) A clock generating device comprising a clock generating section for generating a plurality of clocks having different phases respectively, and a selecting section for selecting some one out of said plurality of clocks on the basis of a selection signal to output it and selecting different clocks respectively for the leading edge and for the trailing edge within one cycle of the clock to be outputted.

(5) A clock generating device comprising a clock generating section for generating a plurality of clocks having different phases respectively, a selecting section for selecting some one out of said plurality of clocks on the basis of a selection signal to output it, and a switching control section for outputting a selection signal to said selecting section within one cycle of the clock to be outputted from said selecting section.

(6) A clock generating device as set forth in the paragraph (5), wherein the aforesaid switching control section generates a selection signal indicating which one is to be selected out of the plural clocks on the basis of output clock information set beforehand to output it to said selecting section.

(7) A clock generating device as set forth in the paragraph (6), further comprising a synchronized signal detecting section for detecting the state of phase difference of the plural clocks outputted from the aforesaid clock generating section, wherein the aforesaid switching control section generates a selection signal indicating which one is to be selected out of the plural clocks on the basis of output clock information set beforehand and the state of phase difference detected by said synchronized signal detecting section to output it to the aforesaid selecting section.

(8) A clock generating device as set forth in the paragraph (6) or (7), wherein the aforesaid output clock information is memorized beforehand in a memory section or is set by an operation circuit.

(9) A clock generating device as set forth in any one of the paragraphs (1) to (8), wherein when the clock which is outputted from the aforesaid selecting section is switched over from one of the plural clocks to another clock, said one clock and said another clock are in the state of the same logic.

(10) A clock generating device as set forth in any one of the paragraphs (1) to (9), wherein the aforesaid clock generating section comprises a delay chain portion for generating a plurality of delayed clocks having different phases respectively.

(11) A clock generating device as set forth in any one of the paragraphs (1) to (9), further comprising a basic clock generating section for generating a tuned basic clock, wherein the aforesaid clock generating section comprises a delay chain portion for generating a plurality of delayed clocks having different phases respectively by delaying the basic clock outputted from said basic clock generating section.

(12) A clock generating device as set forth in the paragraph (11), wherein the aforesaid selecting section selects some one out of the aforesaid basic clock outputted from the aforesaid basic clock generating section and the aforesaid plural delayed clocks outputted from the aforesaid clock generating section.

(13) A clock generating device which outputs a dithering clock being in the state of a diffused frequency band through dispersing the cycle of the clock to be outputted against the basic clock inputted, wherein said dithering clock is generated by using a plurality of clocks having different phases respectively.

(14) A clock generating device as set forth in the paragraph (13), further comprising a basic clock generating section for generating a tuned basic clock, wherein the aforesaid plural clocks having different phases respectively are generated by delaying the basic clock outputted from said basic clock generating section.

(15) A clock generating device as set forth in any one of the paragraphs (1) to (14) which is made up of an integrated circuit.

(16) A clock generating device as set forth in the paragraph (15) which is made up of a digital circuit.

(17) A circuit board provided with a clock generating device as set forth in any one of the above paragraphs (1) to (16).

(18) An image forming apparatus which is controlled by using a clock outputted from a clock generating device as set forth in any one of the above paragraphs (1) to (16).

(19) The method of generating a clock in which some one is selected out of a plurality of clocks having different phases respectively to be outputted and it is switched over to a different clock within one cycle of the clock to be outputted.

BRIEF DESCRIPTION OF THE DRAWINGS

FIGS. 2(a) to 2(n) are time charts for explaining the operation of a clock generating device of an example of the embodiment of this invention;

DETAILED DESCRIPTION OF THE PREFERRED EMBODIMENT

Figure 1:
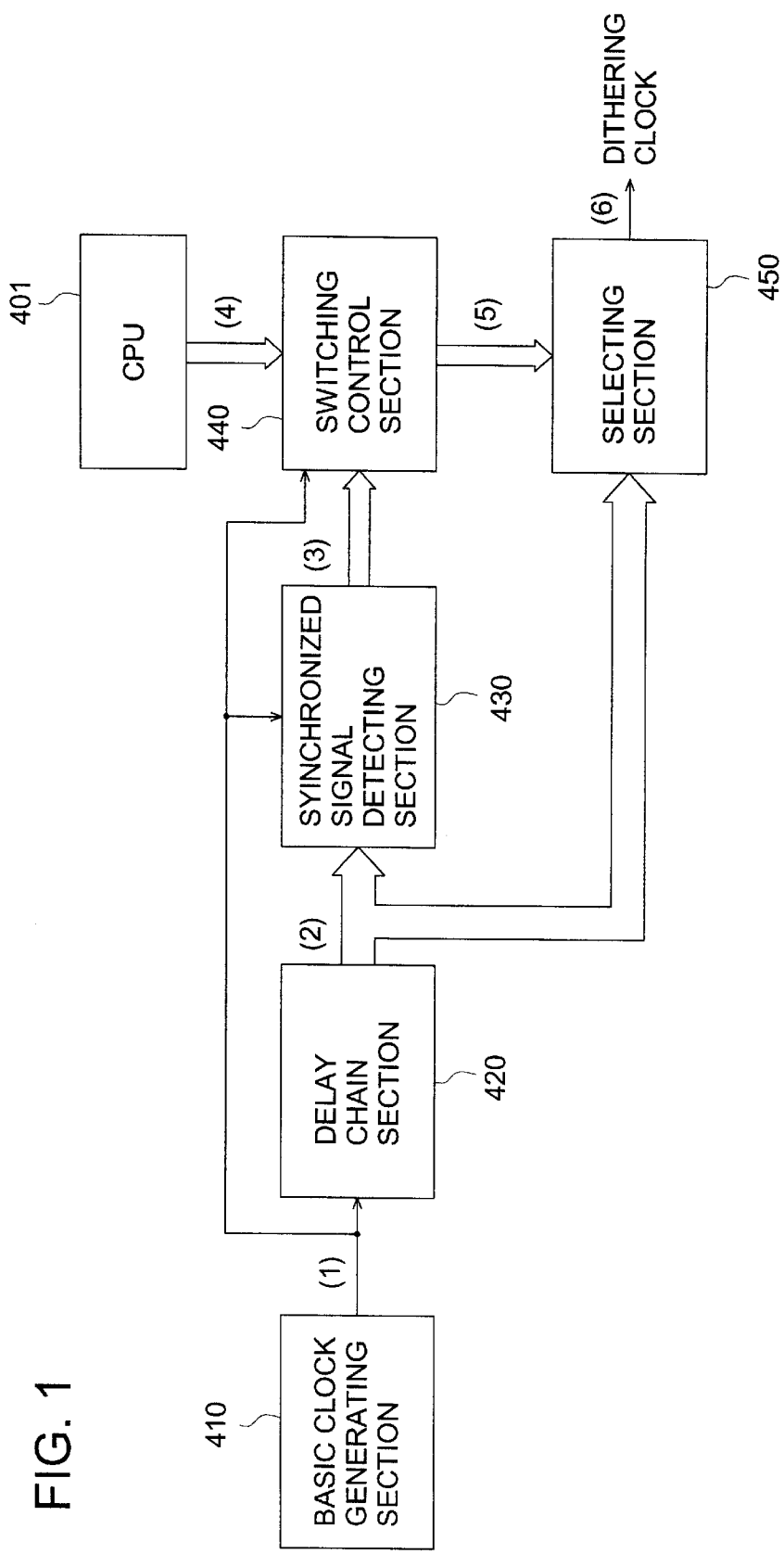
FIG. 1 is a drawing showing the overall electrical structure of a clock generating device of an example of the embodiment of this invention.

In the following, by referring to the drawings, an example of the embodiment of an image forming apparatus and a clock generating device of this invention will be explained in detail.

Overall Structure of a Clock Generating Device

In the following, an example of the embodiment of a clock generating device of this invention will be explained in detail.

In this FIG. 1, the CPU 401 operates as the control means for controlling the whole of a clock generating device of this invention. Further, this CPU 401 makes up means for judging which clock is to be selected within one cycle of the clock.

The basic clock generating section 410 generates a clock to become basic (the basic clock: FIG. 1(1)).

The delay chain portion 420 as a clock generating portion is a group of delay elements making up the clock generating section in the claims of this invention for obtaining a plurality of delayed clocks (the plural clocks: refer to FIG. 1(2) and FIG. 2) having phases a little different from one another respectively by delaying the input signal (the basic clock from the basic clock generating section 410).

In the above, it is desirable that the delay chain portion 420 has a structure such that the delay elements are connected in cascade like a chain to make a number of stages capable of generating the delayed clocks having phases a little different from one another respectively over a time period of the two cycles of the basic clock.

Further, in this embodiment, the delayed clocks are generated by using delay elements, but it is also appropriate to provide a clock generating section capable of generating a plurality of clocks having different phases respectively without using delay elements.

Further, the basic clock generating section 410 may be comprised in each of the clock generating devices, or it is also possible to distribute a basic clock to each of the clock generating devices or to each of the circuit boards from the single basic clock generating section 410.

The synchronized signal detecting section 430 is a synchronism detecting means for detecting the number of the stage (synchronizing point) of the delayed clock which is synchronized with the basic clock (the leading edge position of the desired input signal) among the plural clocks (FIG. 1(2)), and outputs the synchronization information (FIG. 1(3)). In addition, this synchronization information can be also called the state of phase difference, and this state of phase difference includes the synchronizing point and the state of the phase difference itself.

In the above, it is desirable that the synchronized signal detecting section 430 can output the first synchronizing point information V1st for the one synchronized with the basic clock first, the second synchronizing point information V2nd for the one synchronized with the basic clock second, and the number of the stages of the delay element Vprd between them. In the example shown in FIG. 2, the first synchronizing point information V1st=20, the second synchronizing point information V2nd=50, and the number of the stages of the delay element Vprd=30.

The switching control section 440 outputs the selecting stage number information ("selection signal" in the claims: FIG. 1(5)), that is, the information of which phase the clock is to be selected out of the plural clocks (FIG. 1(2)), in order to produce the rise and fall of the clock at desired timings on the basis of the basic clock (FIG. 1(1)) from the basic clock generating section 410, the synchronizing point information (FIG. 1(3)) from the synchronized signal detecting section 430, and the shift information ("output clock information" in the claims: FIG. 1(4)) from the CPU 401.

Figure 3:
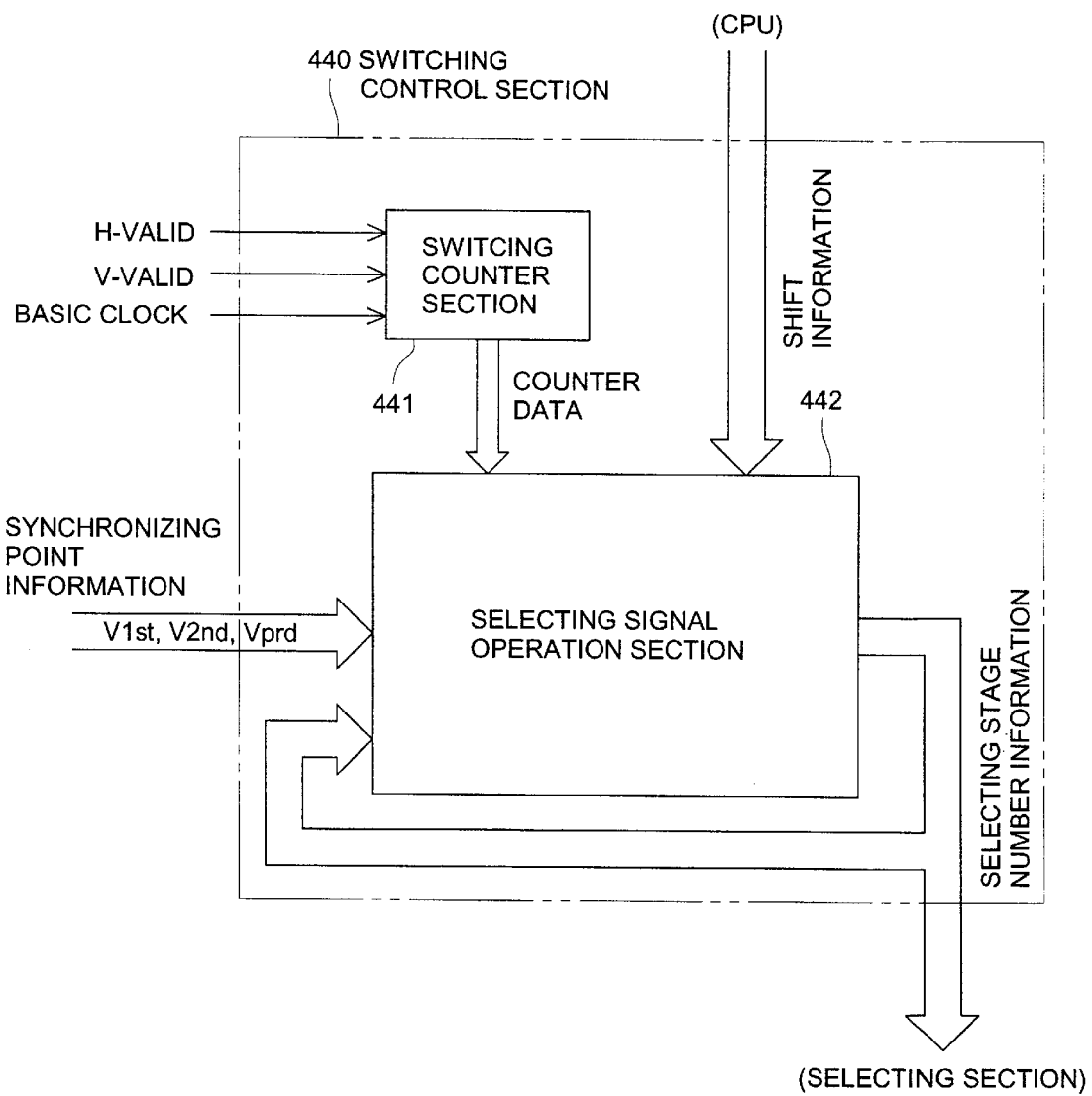
FIG. 3 is a drawing showing the electrical structure of the main part of a clock generating device of an example of the embodiment of this invention.

Moreover, the structure of this switching control section 440 is made as shown in FIG. 3. That is, it is composed of the switching counter portion 441 for generating counter data through receiving the basic clock and the valid timing signals (H_VALID and V_VALID) and the selecting signal operating portion 442 for generating the selecting stage number information (Fsync) through receiving the above-mentioned counter data, the shift information from the CPU 401, and the synchronizing point information (V1st, V2nd, and Vprd) from the synchronized signal detecting section 430.

The selecting section 450 is a selection means which receives the selecting stage number information (FIG. 1(5)) from the switching control section 440, selects clocks so as to obtain a state in which the time intervals are dispersed, and outputs a dithering clock (FIG. 1(6)). In the above, the state in which the time intervals are dispersed is actualized by making the rise and fall of a clock occur at desired timings.

In addition, in this specification, it is called "clock dithering" to obtain the same effect as the frequency modulation by varying the timings of the rise and fall or the cycle of the clock to be outputted. Further, a clock obtained by this clock dithering is to be called a "dithering clock".

The above-mentioned clock generating device shown in FIG. 1 is characterized by it that it selects at least two clocks having different phases from each other out of the plural clocks and combines them to output a composite clock, or it makes a judgement for the selection and composing. For the above-mentioned selection and composing, the following modes such as (a) to (j) can be thought of.

(a) a mode in which some one out of the plural clocks is selected to be outputted, and it is switched over to a different clock and outputted within one cycle of the clock to be outputted.

(b) a mode in which at least two clocks having different phases from one another among the plural clocks are combined and outputted as a composite clock within one cycle of the clock to be outputted.

(c) a mode in which, at the time of selecting and outputting some one out of the plural clocks, it is made within one cycle of the clock to be outputted, a judgement which clock is to be selected.

(d) a mode in which some one is selected and outputted out of the plural clocks on the basis of a selection signal, and different clocks are selected for the leading edge and for the trailing edge within one cycle of the clock to be outputted.

(e) a mode in which, at the time of selecting and outputting some one out of the plural clocks on the basis of a selection signal, the selection signal is outputted to the selecting section within one cycle of the clock to be outputted.

(f) a mode in which, on the basis of the output clock information set beforehand, a selection signal indicating which clock is to be selected out of the plural clocks is generated and outputted to the selecting section.

(g) a mode in which, on the basis of the output clock information set beforehand and the state of phase difference detected by the synchronized signal detecting section, a selection signal indicating which clock is to be selected out of the plural clocks is generated and outputted to the selecting section.

(h) a mode in which the output clock information described in the above (a) to (g) is memorized beforehand in a memory section, or set by an operation circuit.

(i) a mode in which, when the clock to be outputted is switched over from one clock among the plural clocks to another clock, said one clock and said another clock are in the state of the same logic.

(j) a mode in which a plurality of delayed clocks having different phases respectively are generated by delaying the basic clock, and some one clock is selected out of the basic clock and the plural delayed clocks.

Figure 4:
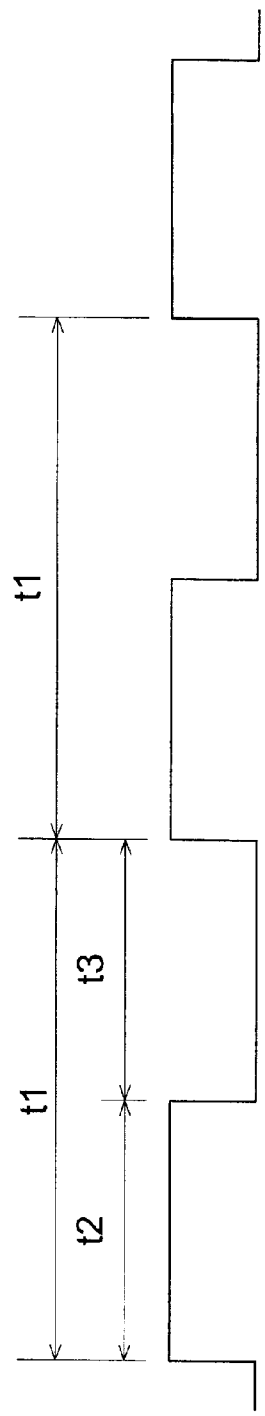
FIGS. 4(a) and 4(b) are time charts for explaining the operation of a clock generating device of an example of the embodiment of this invention.
Figure 4:
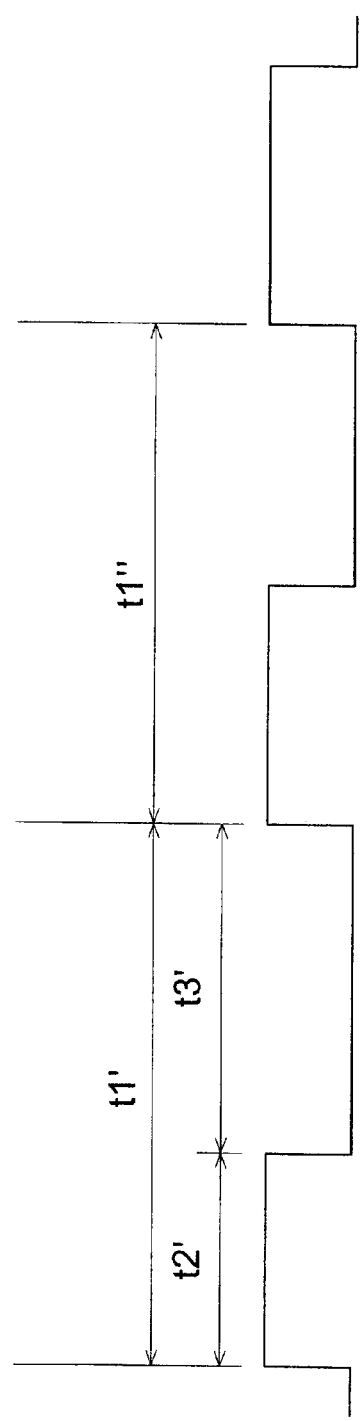

Further, as shown in FIG. 4(a), a clock which is generated by a conventional clock generating device has a constant cycle t1, and t2=t3 (or the ratio of t2 to t3 is constant). On the contrary, as shown in FIG. 4(b), a clock which is generated by a clock generating device according to this example of the embodiment can be made to have a variable cycle t1 (t1'≠t1"), and further, it is possible to make t2'≠t3' (or to make the ratio of t2' to t3' (duty) variable).

Further, with respect to the above-mentioned selection and composition, there is a possibility not only to select clocks having different phases respectively but also to select clocks having the same phase as a result. That is, it is a characteristic of this example of the embodiment to make a judgement in selecting clocks.

Figure 5:
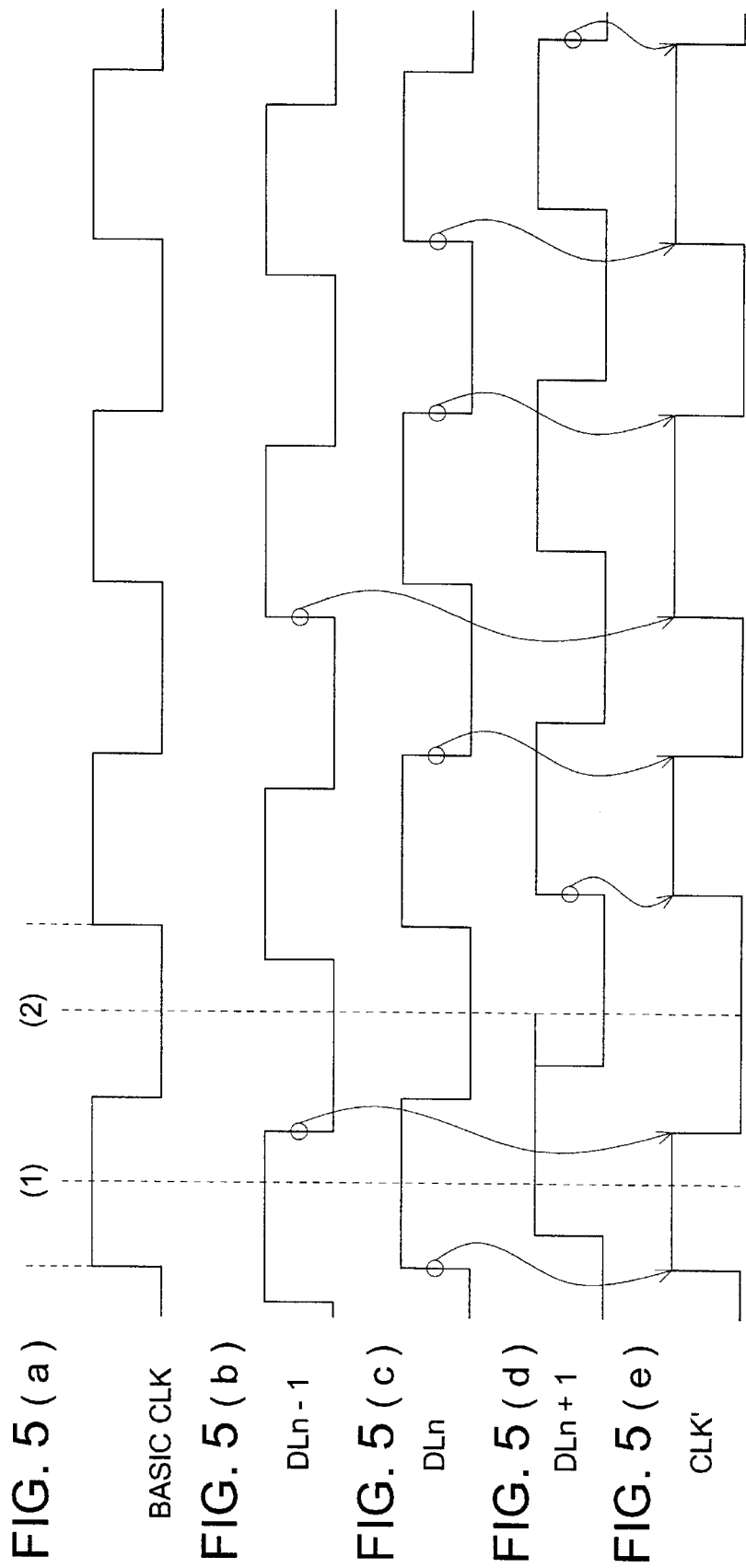
FIGS. 5(a) to 5(e) are time charts for explaining the operation of a clock generating device of an example of the embodiment of this invention.

FIG. 5 is a time chart showing the operation which is a characteristic part of this example of the embodiment, that is, the operation to select at least two clocks having different phases from one another out of the plural clocks to output a composite one within one cycle of the clock to be outputted, schematically in a simplified way.

In this drawing, the basic clock CLK (FIG. 5(a)), the delayed clock DLn−1 as one of the plural clocks (FIG. 5(b)), the delayed clock DLn as one of the plural clocks (FIG. 5(c)), the delayed clock DLn+1 as one of the plural clocks (FIG. 5(d)), and the output clock CLK' obtained by selecting and combining at least two clocks having different phases from one another out of the plural clocks (FIG. 5(e)) are shown.

In this FIG. 5, in order to make the explanation simple, the three clocks DLn−1, DLn, and DLn+1 are shown as the plural clocks. Further, by selecting the leading edge and the trailing edge from at least two clocks having different phases from one another respectively within one cycle of the clock to be outputted (the output clock) and combining the results of the selection, the output clock CLK' shown in FIG. 5(e) is generated.

As the result of this, it becomes possible to obtain the state shown in FIG. 4(b), that is, the state in which the clock cycle t1 is made variable, and the duty of the clock is also made variable.

Further, in this example of the embodiment, because at least two clocks having different phases from one another are selected to compose an output clock, it is possible to control the position of the leading edges and the trailing edges of the clock arbitrarily.

In order to generate an output clock having desired rise and fall timings by selecting plural clocks as described in the above, for the shift information from the CPU 401, shift amount information (information on the interval between the selected stage numbers), number of shift times information (information on the repeating of the operation), shift mode information (information for prolonging (shortening) the cycle, etc. are given to the switching control section 440. In addition, the CPU 401 generates the above-mentioned sorts of shift information (output clock information) by referring to a memory portion such as a built-in or external ROM or a table.

Then, in accordance with the above-mentioned sorts of shift information, the switching control section 440 outputs the selecting stage number information (FIG. 1(5)), that is, the information on of which phase the clocks are to be selected out of the plural clocks (FIG. 1(2)), to the selecting section 450. Then, receiving the selecting stage number information from the switching control section, the selecting section 450 selects clocks in such a manner as to make the output clock (dithering clock) have its time intervals put in a dispersed state, to output it.

Further, in FIG. 5, regarding the selection of the plural clocks for generating a dithering clock, to state it concretely, it is done at the timing of about ¼ of one cycle (FIG. 5(1)) and that of about ¾ of one cycle (FIG. 5(2)) of the basic clock, in order to make the logic of the both clocks selected the same (H and H: FIG. 5(1), or L and L: FIG. 5(2)). By doing this, a noise is not produced, and a stable operation can be actualized. In the case of FIG. 5, it is shown an example in the case where plural clocks are selected at timings near the timing FIG. 5(1) when the logic of the both clocks are H and H. That is, this invention is characterized by it that, in switching over the output clock from one clock to another among the plural clocks in the selecting section 450, said one clock and said another clock are in the state of the same logic.

Further, in the example shown in FIG. 5, the leading edges and the trailing edges of the output clock are determined from the three kinds of clocks; however, actually they are selected out of a number of clocks from the delay chain section 420, therefore with respect to the leading edges and the trailing edges of the output clock, it is possible to control them to come to an arbitrary position for every clock pulse.

Figure 6:
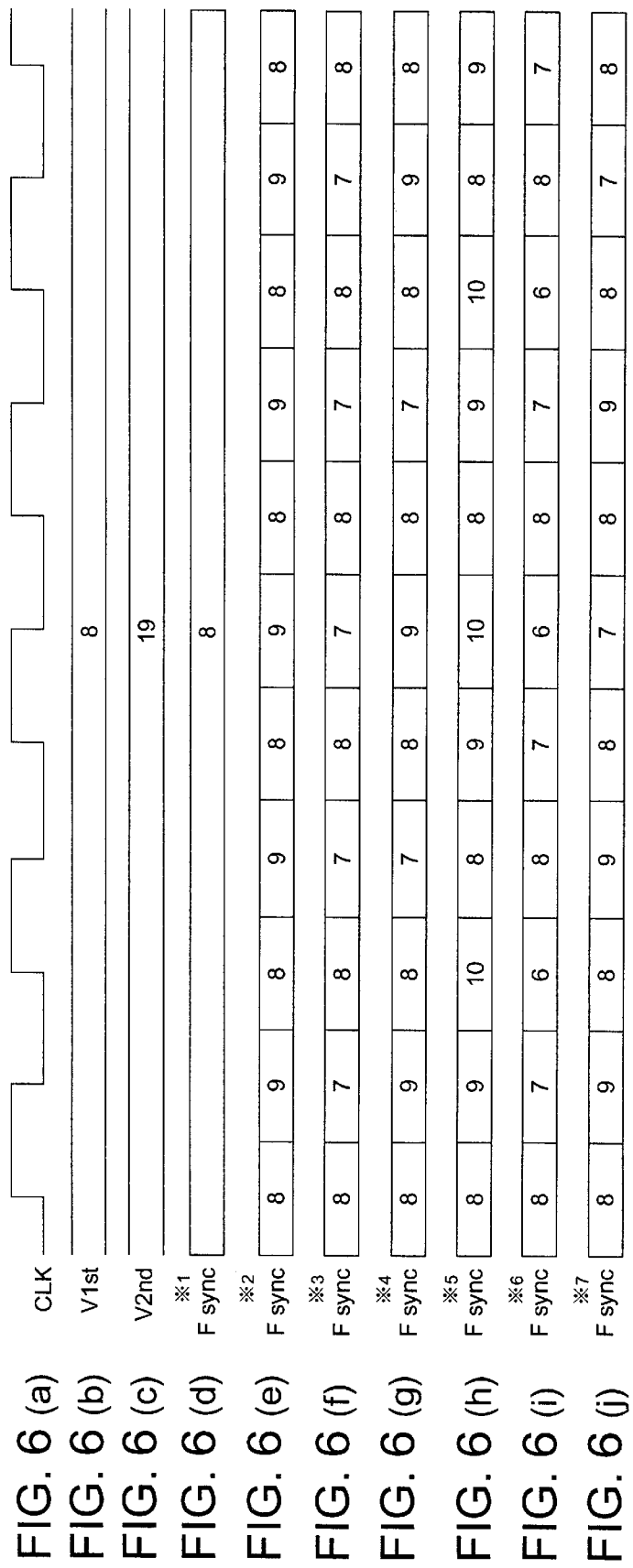
FIGS. 6(a) to 6(i) are time charts for explaining the operation of a clock generating device of an example of the embodiment of this invention.

Further, FIG. 6 is a time chart showing various kinds of states of the shift information in the case where the first synchronizing point information V1st=8, the second synchronizing point information V2nd=19, and the stage number information Vprd=11.

In this drawing, it is shown how are Fsync in the case where no signal control is done (FIG. 6(d)), Fsync in the case where a signal control is once carried out in the +direction (FIG. 6(e)), Fsync in the case where a signal control is once carried out in the −direction (FIG. 6(f)), Fsync in the case where a signal control is once carried out in the ±direction (FIG. 6(g)), Fsybc in the case where a signal control is twice carried out in the +direction (FIG. 6(h)), Fsync in the case where a signal control is twice carried out in the −direction (FIG. 6(i)), and Fsync in the case where a signal control is once carried out in the random direction (FIG. 6(j)).

As explained in the above, by selecting at least two clocks having different phases from one another out of the plural clocks within one cycle of the clock to be outputted and combining them to output a composite clock, it is possible to vary the frequency of the output clock (dithering clock) to some extent.

Figure 7:
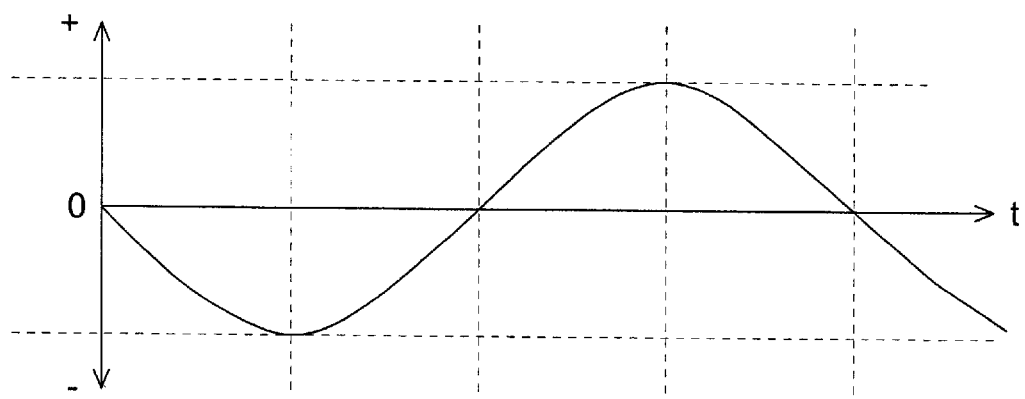
FIGS. 7(a) and 7(b) are time charts for explaining the operation of a clock generating device of an example of the embodiment of this invention.
Figure 7:
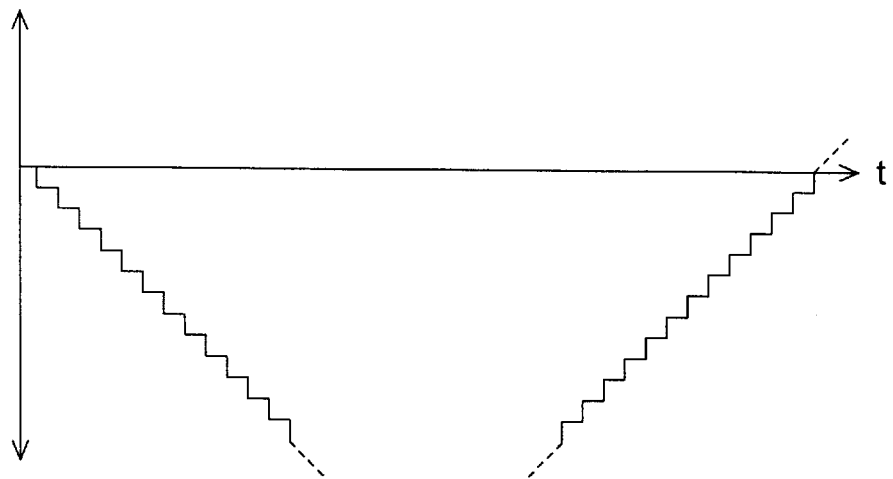

In this case, as shown in FIG. 7(a), it is possible to obtain the same result as the frequency modulation by varying the frequency of the output clock in a manner such that the frequency deviation with time has a shape of a sine wave. Further, actually, to observe the frequency deviation in detail, it varies in a manner as shown in FIG. 7(b), because it is carried out by a digital circuit. In addition, an example of a sine wave is shown in this drawing, but the shape of the wave may be triangular, rectangular, or of any other arbitrary shape. For the purpose of such a control, by referring to a memory portion such as a built-in or external ROM or a table, the CPU 401 generates the shift information (output clock information) for generating such a triangular wave, a rectangular wave, or a wave of an arbitrary shape as mentioned in the above.

Figure 8:
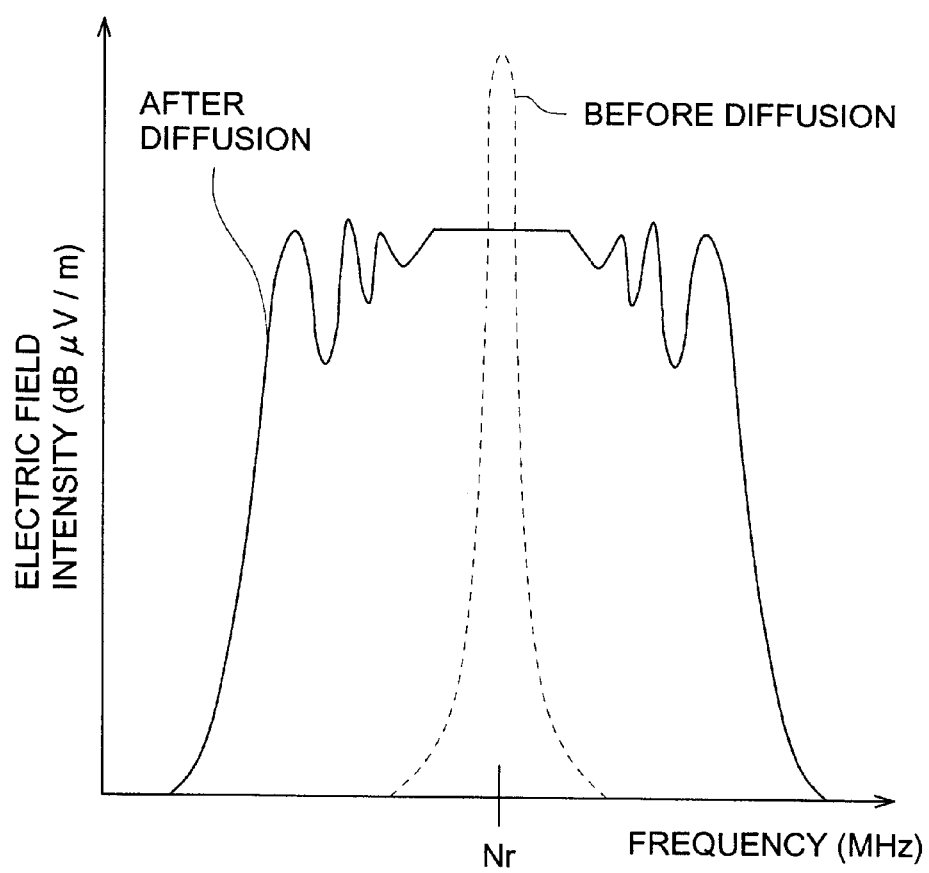
FIG. 8 is a drawing showing the characteristic of the frequency band of a dithering clock generated by a clock generating device of an example of the embodiment of this invention.

In the above case, because a frequency deviation is produced as in the case of the frequency modulation, the frequency band of the output clock results in being broadened. As the result of this, the spectrum of the electromagnetic radiation generated by the clock or its higher harmonics is broadened and the peak intensity of the electric field is reduced (refer to FIG. 8). Owing to this, if a clock generating device of this example of the embodiment is used for a countermeasure against EMI, a good result can be obtained.

Further, regarding a clock generating device of this example of the embodiment and a circuit board provided with the clock generating device, the control of precision is easy because the whole is made up of a digital circuit. Further, because it is a digital circuit, it has the advantage that it is easy to handle.

Further, in the above structure, each of the components such as the basic clock generating section only, the delay chain section only, the control section only, the selecting section only, or the CPU only may be independently arranged, but it is also possible to arrange them as an integrated circuit on one chip by combining them. In this case, by making it an integrated circuit, it has the advantage that it can actualize a small-sized circuit and becomes easy to handle. Furthermore, it is possible to make up the chip of a device having a portion for use in common to the above-mentioned components. Further, it is possible to dispose the clock generating device of this example of the embodiment on the same circuit board together with other digital circuits.

Another Example of the Embodiment: An image Forming Apparatus (1)

An example of the embodiment of an image forming apparatus, to which a clock generating device of this invention is applied, will be explained. In the following, this invention will be explained on the basis of the drawings, but before this, the outline of a digital copying machine provided with an image forming apparatus and an image reading apparatus is to be explained.

Figure 9:
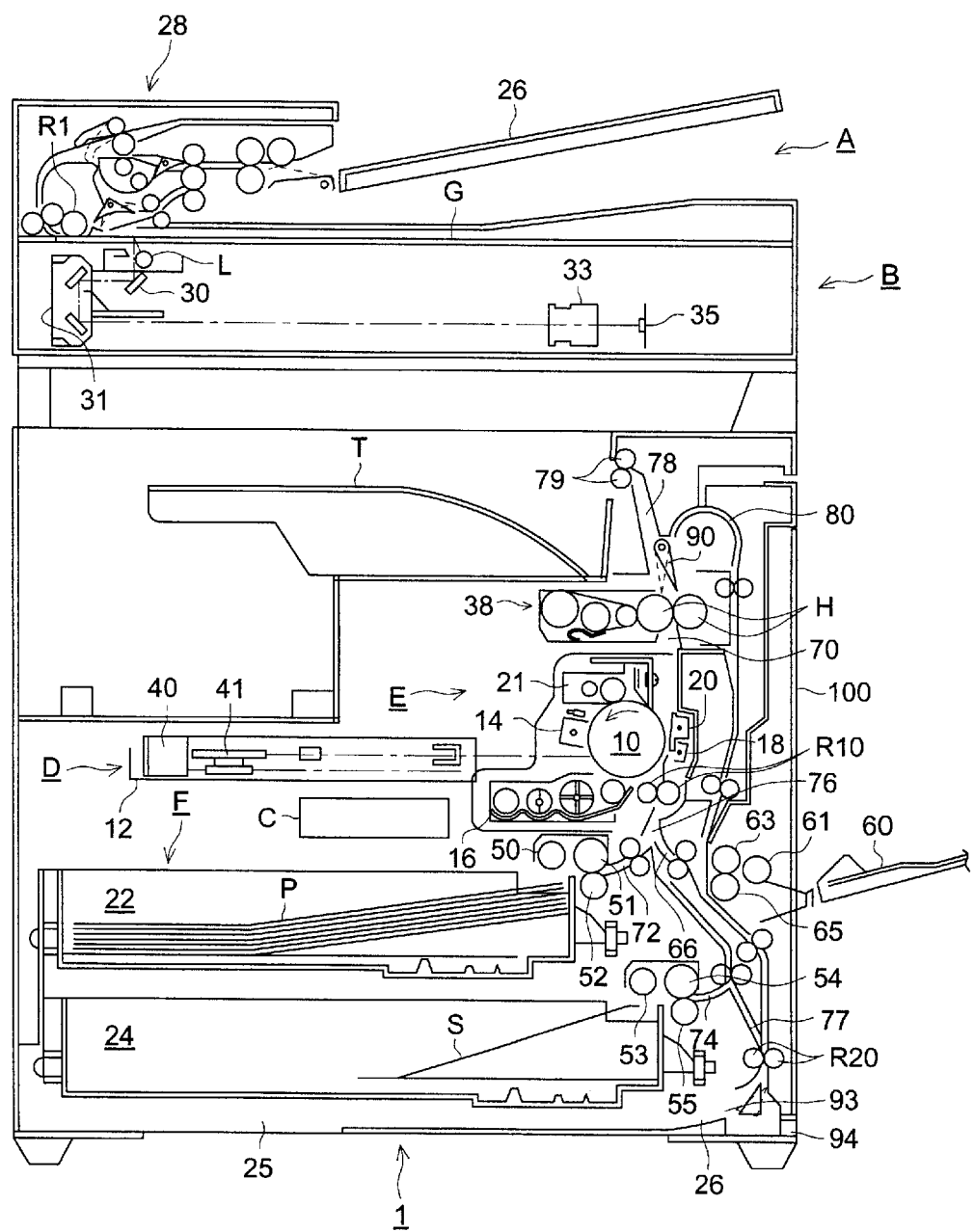
FIG. 9 is a drawing showing the cross-sectional structure of an image forming apparatus to which a clock generating device of this invention is applied.

FIG. 9 is a cross-sectional view showing schematically the structure of the side cross-section of a digital copying machine (hereinafter referred to as a copying apparatus simply) 1.

In this FIG. 9, the copying apparatus 1 comprises the automatic document feeder (usually called the ADF) A, the document image reading section B for reading an image of an original document fed by the automatic document feeder A, and the image forming section (no sign attached) for forming an image read by the document image reading section B on a recording paper sheet; the document image reading section B is provided above the image forming section, and the automatic document feeder A is provided above the document image reading section B.

The image forming section comprises the writing section D for carrying out writing in accordance with read image data, the engine section E for carrying out image formation on a sheet of recording paper, the plural paper sheet containing means (hereinafter referred to as paper feed trays or simply trays) 22 and 24 such as trays containing the recording paper sheets (hereinafter referred to as the sheets) P.

The automatic document feeder A is mainly composed of the document setting base 26, the group of rollers including the roller RI, and the document conveyance processing section 28 including the switching means (no sign attached) for suitably switching over the pathway of the document etc. The document image reading section B is composed of the two mirror units 30 and 31 which is disposed under the top glass G and movable back and forth with the length of the optical path kept constant, the fixed image forming lens (hereinafter referred to as the lens simply) 33, the line-shaped image sensor (hereinafter referred to as the CCD) 35, etc. Although the automatic document feeder A is different in its structure from a conventional automatic document feeder, the principle itself is known publicly, and the document image reading section B is well known, therefore, the explanation of these is to be done simply.

The writing section D is composed of the laser light source (hereinafter referred to the LD also) 40, the polygonal mirror (it is a light deflector, and hereinafter referred to as the polygon also) 42, etc., and carries out image exposure based on the image data onto the image carrying member 10. The engine section E is composed of the image carrying member 10 made up of a photoreceptor drum, the charging electrode 14, the developing means 16 made up of a magnetic brush developing apparatus, the transfer electrode 18, the detaching electrode 20, the cleaning means 21, the fixing means H, etc., and is means for forming an image on a sheet. This engine section E forms a toner image on the image carrying member 10, and transfers said toner image to a sheet, to fix the toner image on the sheet; because the structure and the process are well known, its explanation is to be done simply.

In the above-mentioned structure, the process of forming a toner image on the image carrying member 10, transferring it onto a sheet, and then ejecting the sheet on an output tray is as follows in brief.

A sheet of a document (not shown in the drawing) set on the document setting base 26 is conveyed in the document conveyance processing section 28, and during the passage under the roller R1, a slit exposure by the exposure means L is carried out. The reflected light from the document sheet is converged on the aforesaid CCD through the aforesaid mirror units 30 and 31 and the lens 33, and the image is read. The image information (image data) having been read by the document image reading section B is subjected to image processing, and is compressed, to be stored in the image memory Z3.

Then, the image data stored in the image memory Z3 is read out in response to image formation, and is expanded; the LD 40 in the writing section D is driven in accordance with said image data, to make an exposure on the image carrying member 10. Before this exposure, the image carrying member rotating in the direction of the arrow mark (counter-clock direction) is charged to a specified electric potential by the corona discharging action of the charging electrode 14, and the electric potential of the exposed area is reduced in accordance with the exposure amount, resulting in the formation of an electrostatic latent image on the image carrying member 10 in accordance with the image data. The electrostatic latent image is reversely developed by the aforesaid developing means 16, to become a visible image (a toner image).

On the other hand, before the leading edge portion of the toner image on the image carrying member 10 reaches the transfer zone, a sheet P, for example in the paper feed tray 22, is conveyed to reach the registration rollers R10, by which its leading edge is regulated. The sheet P is conveyed to the transfer zone by the registration rollers R10, which start rotating in synchronism with the toner image formed on the image carrying member 10, in order that it may come to be superposed on the toner image, that is, the area of the toner image formed on the image carrying member 10. In the transfer zone, the toner image on the image carrying member 10 is transferred onto the sheet P by the actuation of the transfer electrode, and then said sheet P is detached from the image carrying member 10 by the actuation of the detaching electrode 20.

After that, by the application of the pressure and heat by the fixing means H, the toner particles forming the aforesaid toner image are fused and fixed on the sheet P, which is then ejected onto the output tray T through the ejection path 78 and the ejection rollers 79 as an ejection means.

In addition, in FIG. 9, the sheet P is shown in the paper feed tray 22 only.

In this drawing, the reference sign S in the paper feed tray 24 is a movable plate, the free end of which is always urged upward by an urging means such as a coil spring (not shown in the drawing); as the result of this, the topmost sheet is brought into contact with the conveying-out roller to be described later. In addition, the paper feed tray 22 also has the same structure as that described in the above. The paper feed trays 22 and 24 are paper containing feed means which contain sheets, and in the embodiment, they are arranged vertically in two stages; however, more number of paper feed trays can also be provided.

Between this paper feed tray 24 and the bottom wall of the apparatus mainframe, the space portion 25 with a specified spacing is formed. This space portion 25 is used in the mode in which an image is formed on each of both sides of a sheet P, and is a part of the second conveyance path 80 (to be described later) for reversing a sheet upside down, to make up the reversing path for reversing a sheet upside down.

Above the front end portion (the portion corresponding to the leading edge of a sheet P contained with respect to the paper feeding direction) of each of the paper feed trays 22 and 24, there are provided the conveying-out rollers 50 and 53, the feed rollers 51 and 54, which are located at the downstream side of the conveying-out rollers 50 and 53 respectively, and the double-feed preventing rollers 52 and 55 pressed to the feed rollers 51 and 54 respectively for preventing the multiple-feed of the sheets P; these are paper feeding means for conveying out a single sheet separately from other sheets contained in the paper feed tray 22 and 24 one by one.

60 denotes the manual feed tray as an outside-located sheet containing means, at least a part of which is projected out of the image forming apparatus mainframe, for setting sheets, and has such a structure as to be capable of opening and closing with its lower end made as a supporting point against the side wall of the image forming apparatus mainframe. In order to feed out a sheet P set on the manual feed tray 60 to accompany image formation, the conveying-out roller 61, the feed roller 63 located at the downstream side of the conveying-out roller 61, and the double-feed preventing roller 65 for preventing multiple-feed of the sheets P compose the outside paper feeding means having substantially the same structure to perform the same function as the paper feeding means which are provided corresponding to the above-mentioned paper feed trays 22 and 24 respectively.

For the pathway of a sheet, the image formation path 70 (extending from the lower part to the upper part with respect to the moving direction of the sheet) for making the sheet P be subjected to image formation (image recording) on it, the upper sheet conveyance path 72 for conveying the sheets contained in the upper paper feed tray 22, the lower sheet conveyance path 74 for conveying the sheets contained in the lower paper feed tray 24, and the sheet ejection path 78 for ejecting the sheet having been subjected to image formation onto the output tray T are provided. That is, a sheet can be conveyed from each of the paper feed trays 22 and 24 through the image forming means E to the ejection rollers 79. This conveyance path to convey a sheet is called the first conveyance path in this specification. In addition, this first conveyance path is the conveyance path in which a sheet is conveyed in the case where an image is formed on the one side of the sheet.

The (upper) bifurcating guide 90 is controlled in such a manner as to let a sheet P having an image formed on its first side or a sheet P having images on its both sides respectively proceed to the sheet ejection path 78 or to the second conveyance path 80 to be described later. In other words, it is controlled in accordance with the mode of the image formation set by a user (a mode in which an image is formed on the one side of a sheet only, or a mode in which images are formed on the both sides of a sheet respectively), and is a switching means for switching over the pathway of the sheet P being conveyed upward in FIG. 9 in the image formation path 70 to the sheet ejection path 78 or to the second conveyance path. To state it concretely, in the case where the mode in which image formation on both sides of a sheet is to be carried out has been set, the bifurcating guide 90 is controlled to come to the position indicated by the broken line in the drawing through a control section (not shown in the drawing) in order that the sheet P, which has been subjected to image formation for its first side to have a toner image transferred, may be fed into the second conveyance path 80. Further, in the case where the mode in which image formation on one side of a sheet is to be carried out is set, or in the case where the mode in which image formation on both sides of a sheet is to be carried out has been set, and a sheet having an image on each of its both sides formed already is to be conveyed, the bifurcating guide 90 is controlled to come to the position shown by the solid line in the drawing through the control section (not shown in the drawing).

Further, the image forming apparatus comprises the second conveyance path 80 in order to make it possible to form an image again on the sheet on one side of which an image has already been formed. The image forming process for the second side of a sheet is as follows.

As described in the above, when a sheet P having been subjected to image formation for the first side moves upward in the first conveyance path (the image formation path 70) and its leading edge reaches the bifurcating guide 90, because said bifurcating guide 90 is kept at the position shown by the broken line in the drawing, the sheet P enters the second conveyance path 80, to continue to move. The entrance portion of the second conveyance path 80 has a shape of a gentle circular arc, which secures smooth moving of the sheet P. Then, the sheet P, having made a U-turn as drawing a circular arc at the entrance portion of the second conveyance path 80, moves down in the second conveyance path toward the reversing path, is gripped by the reversing rollers R20, and is conveyed out toward the bifurcating guide 93. At this time, because the bifurcating guide 93 is at the position shown by the solid line in the drawing, said sheet P being conveyed out is guided to the aforesaid space portion 25 formed under the lower paper feed tray 24. The first side with an image formed of this sheet P, which has been guided to this space portion 25, faces down.

Then, the reversing rollers R20 stop rotating with the trailing edge of the sheet P gripped between them, and after that, when they start rotating in the direction reverse to the above-mentioned, the sheet P is conveyed into the first conveyance path (through the lower conveyance path 74 to the image formation path 70, as kept reversed upside down, that is, with its second side having no image formed made to face the image carrying member 10, and its leading edge is regulated by the registration rollers R10.

On the other hand, on the image carrying member 10, the second toner image has already been formed by the above-mentioned process, and when the registration rollers R10 start rotating in synchronism with the rotation of said image carrying member 10, the sheet P enters the transfer zone as kept in the state of being superposed on the second toner image area. Then, after it is subjected to transfer processing, detaching processing, and fixing processing, when the leading edge of the sheet P having an image for the rear side formed reaches the portion at which the bifurcating guide 90 is located, the bifurcating guide 90 is kept at the position shown by the solid line in the drawing, which brings the image formation path 70 into the state of leading to the sheet ejection path 78 and breaks the leading to the second conveyance path 80; therefore, the sheet P enters the sheet ejection path 78, and is ejected onto the output tray T through the ejection rollers 79.

Incidentally, regarding the manual feed tray 60 provided at the manual feeding section, in this embodiment, as shown in FIG. 1, it is provided on the opening-closing door 100 the outside surface of which makes the side wall of the apparatus mainframe. Further, including the manual feed tray 60, the paper feeding means for conveying out the sheets set on the manual feed tray 60 is mounted to the opening-closing door at approximately the same height position as the paper feeding devices for the paper feed tray 22.

The conveyance path 66 for the sheet P which is conveyed into the apparatus from on the manual paper feed tray 60 (hereinafter referred to as the third conveyance path) has such a structure as to extend across the aforesaid second conveyance path 80 to lead to the first conveyance path.

To state it concretely, it has such a structure as to have its end at the point before the image recording portion, in which the transfer electrode 18 is located, that is, at the upstream side of it with respect to the sheet conveying direction in the image formation path 70, and to state it more concretely, at the junction point 76 before (at the upstream side of) said registration rollers R10.

Figure 10:
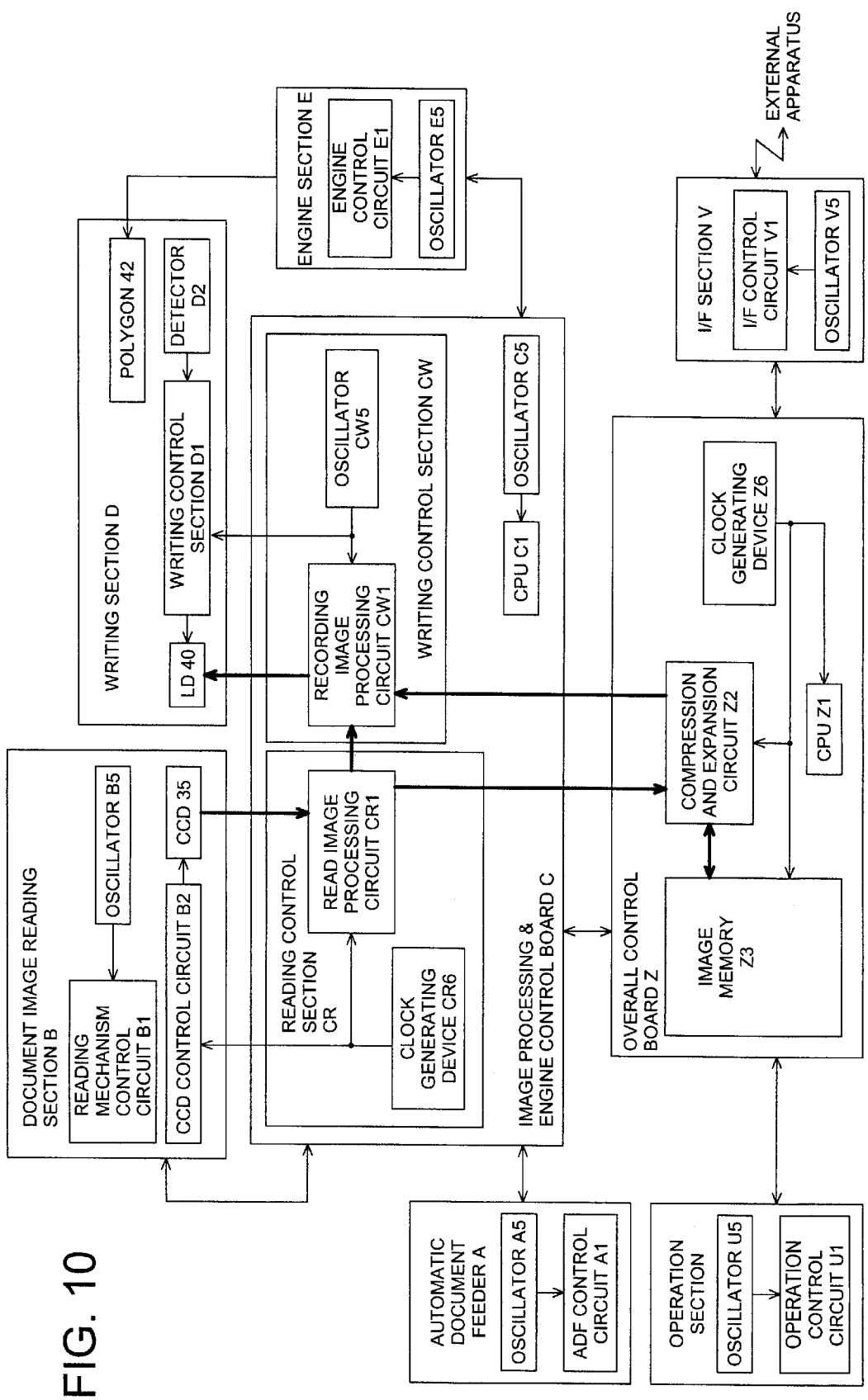
FIG. 10 is a block diagram showing the outline of the structure of the control system of an image forming apparatus according to the embodiment of this invention.

FIG. 10 is a block diagram showing the control system of the copying machine 1.

As described in the foregoing, the automatic document feeder A is an apparatus carrying out conveyance of a document, and for its control system, it comprises the ADF control circuit A1 as a control circuit for controlling the driving of the automatic document feeder A, and the oscillator A5 for generating a clock. This oscillator A5 is a circuit for generating a usual clock. Further, the ADF control circuit A1 is a circuit for controlling the driving of the document conveyance processing section 28 including a group of rollers, switching means, etc., a sensor (not shown in the drawing) for carrying out the size detection of the document, etc., and may be made up of a gate array only, or may comprise a CPU as well as a ROM, a RAM, etc. in addition to a gate array. This ADF control circuit A1 is driven by a clock which is generated by the oscillator A5. Further, the automatic document feeder A carries out the giving and receiving of data with the image processing and engine control board (hereinafter referred to as the engine control board) C, and the control of document conveyance is carried out as being controlled by the engine control board C.

As described in the above, the document image reading section B is a section for photoelectrically converting an image of a document, and for its control system, it comprises the reading mechanism control circuit B1 as a control circuit for controlling the driving of the mechanism of the document image reading section B, the oscillator B5 for generating a clock, and the CCD control circuit B2 as a photoelectric conversion control circuit for controlling the CCD 35 as a photoelectric conversion portion. This clock generating device B5 is a circuit for carrying out the generation of a usual clock like the above-mentioned oscillator A5. Further, the reading mechanism control circuit B1 is a circuit for controlling the driving of the mechanical system of the document image reading section B such as the movement of the aforesaid two mirror units 30 and 31 and the movement of the lens 33 in accordance with the enlargement and reduction; it may be made up of a gate array only, or it may comprise a CPU as well as a ROM, a RAM, etc. in addition to a gate array. This reading mechanism control circuit B1 is driven by a clock generated by the clock generating device B5.

Further, the CCD control circuit B2 is a control circuit for driving the CCD 35. This CCD driving circuit B2 is driven not by a clock from the clock generating device B5, but by a dithering clock from the clock generating device CR6 as described later. Further, the document image reading section B carries out the giving and receiving of data with the engine control board C to be described later, and carries out the control as being controlled by the engine control board C.

As described in the above, the writing section D is a section for carrying out writing in accordance with image data; for its control system, it comprises the writing control circuit D1 for controlling the modulation of the light emitted by the LD 40 on the basis of the image data, and the detector (index sensor) D2 for detecting the light emitted by the LD 40 and deflected by the polygon 42 as a deflector to output an index signal. In the above, the detector D2 outputs an index signal by detecting the light of the LD 40 for each of main scanning lines arranged in the sub-scanning direction (the moving direction of the image carrying member 10), and the writing in the main scanning direction is started on the basis of this index signal; because this structure itself is known to the public, the explanation is omitted in this specification. The writing control circuit D1 is a circuit for carrying out the control of the intensity modulation and/or the pulse width modulation of the LD 40 based on the image data, and may be made up of a gate array only, or it may comprise a CPU as well as a ROM, a RAM, etc. in addition to a gate array. This writing control circuit D1 is driven by a clock generated by the oscillator CW1 to be described later. Further, the writing section D carries out the giving and receiving of data with the engine section E and the engine control board C to be described later, and carries out the exposure (writing) based on the image data as being controlled by the engine section E and the engine control board C.

As described in the above, the engine section E is a section for forming an image on a sheet, and for the control system, it comprises the control circuit E1 and the oscillator E5 for generating a clock. This clock generating device E5 is a circuit for carrying out the generation of a usual clock like the above-mentioned oscillator A5. Further, the engine control circuit E1 is a circuit for controlling the driving of the above-mentioned image carrying member 10, the charging electrode 14, the developing means 16, the transfer electrode 18, the detaching electrode 20, the fixing means H, etc., and it may be made up of a gate array only, or it may comprise a CPU as well as a ROM, a RAM, etc. in addition to a gate array. This engine control circuit E1 is driven by a clock generated by the clock generating device E5. The engine section E carries out the giving and receiving with the engine control board C to be described later, and carries out the control as being controlled by the engine control board C.

The operation section U is a section for carrying out the setting of the state of the operation of the copying machine or the operation by a user in the operation panel provided at the front side of the copying machine 1 (a panel provided with a display portion such as a liquid crystal and an input portion such as a touch panel or keys), and for the control system, it comprises the operation control circuit U1 for carrying out the control of the display of the operation panel and the detection of the pressing of the touch panel or the keys, and the oscillator U5 for generating a clock. This oscillator U5 is a circuit for generating a usual clock like the above-mentioned oscillator A5. Further, the operation control circuit U1 is a circuit for making the control such as the control of the display on the liquid crystal and the detection of the pressing of the touch panel or the keys, and it may be made up of a gate array only, but because of the large number of the characters to be displayed, it is desirable that it comprises a CPU as well as a ROM, a RAM, etc. in addition to a gate array. This operation control circuit U1 is driven by a clock generated by the clock generating device U5. The operation section U carries out the giving and receiving of data with the overall control board Z to be described later, and carries out the control as being controlled by the overall control board Z, while it transmits the information set by a user to the overall control board Z.

The interface section (hereinafter referred to as the I/F section) V is a interface section for carrying out the communication (giving and receiving of data) with an external apparatus (for example, it is an external apparatus such as a FAX machine or a print controller, and in this case, it may be one built in the copying machine 1.), and for the control system, it comprises the I/F control circuit V1 for carrying out the control of the interface with the external apparatus, and the oscillator V5 for generating a clock. This oscillator V5 is a circuit for carrying out the generation of a usual clock like the above-mentioned oscillator A5. Further, the I/F control circuit V1 is a circuit for carrying out the control of the interface, and it may be made up of a gate array only, or it may comprise a CPU as well as a ROM, a RAM, etc. in addition to a gate array. This I/F control circuit V1 is driven by a usual clock generated by the oscillator V5. The I/F section carries out the giving and receiving of data with the overall control board Z to be described later, and carries out the control as being controlled by the overall control board Z, while it transmits the information from an external apparatus to the overall control board Z.

The engine control board C is a circuit board for controlling the automatic document feeder A, the document image reading section B, the writing section D, the engine section E, etc., while carrying out the control of the sheet conveyance and image processing, and it comprises the CPU C1 for managing the control of these controls, the oscillator C5 for generating a clock, the reading control portion CR for carrying out the image processing of read image data etc., and the writing control portion CW for carrying out the image processing of image data to be written. This oscillator C5 is a circuit for generating a usual clock like the above-mentioned oscillator A5. Further, the CPU C1 functions as a control circuit for carrying out various kinds of controls on the basis of a program stored in a ROM (not shown in the drawing), using a RAM (not shown in the drawing) as an operation area. This CPU C1 is driven by a clock generated by the oscillator C5. In addition, this engine control board C has such a structure as to carry out the giving and receiving of data with the automatic document feeder A, the document image reading section B, the writing section D, the engine section E, and the overall control board Z to be described later, and controls the automatic document feeder A, the document image reading section B, the writing section D, and the engine section E under the control by the overall control board Z.

The reading control portion CR is a portion for giving a clock for controlling the CCD control circuit B1, while carrying out the image processing of the image data obtained by the photoelectric conversion by the CCD 35, and constitutes a part of the image reading apparatus together with the document image reading section B. This reading control portion CR comprises the read image processing circuit CR1 for carrying out the image processing of image data and the clock generating device CR6 for generating a dithering clock. The read image processing circuit CR1 is a circuit for applying the image processing such as area discrimination, brightness/density conversion, filter, re-sizing, gamma transformation, error diffusion, and smoothing to the image data read by the CCD 35, and it may be made up of a gate array only, or it may comprise a CPU as well as a ROM, a RAM, etc. in addition to a gate array. This clock generating device CR6 is a circuit for carrying out the generation of a dithering clock.

Figure 11:
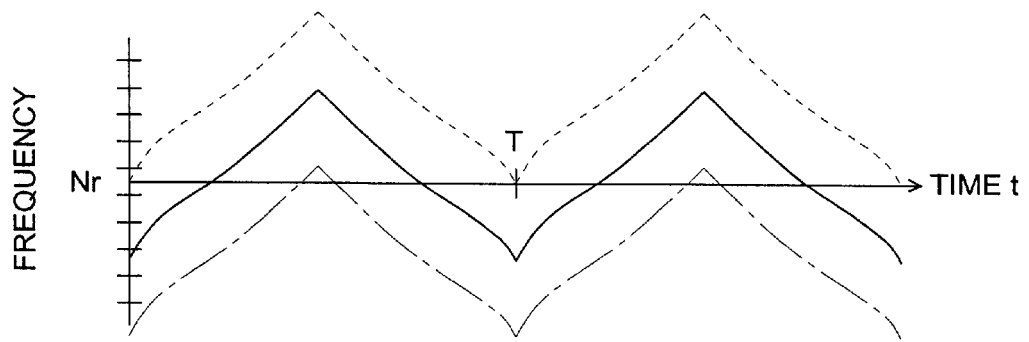
FIG. 11 is a drawing showing the modulation profile of a clock generating device.

The clock generating device CR6 described in the above is one that selects desired clocks out of the plural clocks so as to bring the time intervals into a dispersed state to output a dithering clock. This dithering clock is one that has its frequency modulated at specified intervals of the cycle T on the basis of a specified modulation profile such as shown in FIG. 11. Further, the width of this frequency deviation (that is, the band width), the modulation width (the width in the left-to-right direction in FIG. 8, or the width up-to-down direction in FIG. 11) is within ±10% (or desirably within ±5%, further more desirably within ±2%) of the central frequency of the diffused dithering clock (the frequency Nr, in the case where the frequency deviation is produced with the frequency of the basic clock signal Nr made the center) (the solid line in FIG. 11).

Further, the modulation is not necessarily done by making the frequency of the basic clock signal be the central frequency in the modulation width, but it is appropriate to make the frequency of the basic signal be the maximum frequency in the modulation width (the single dot and dash line in FIG. 11), or on the contrary, it is appropriate to make it be the minimum frequency in the modulation width (the broken line in FIG. 11).

Further, it is appropriate to make the modulation profile a sine wave or the like, however, it is desirable to use a modulation profile such as shown in FIG. 11 for the purpose of reducing the peak of EMI component, because the clock is kept at a constant frequency for a short time to make it possible to diffuse the spectrum uniformly.

Further, this dithering clock is inputted to the read image processing circuit CR1 as the driving clock for the read image processing circuit CR1, which is driven by this dithering clock. Furthermore, this dithering clock is also inputted to the CCD control circuit B1 as the driving clock for the CCD control circuit B1, which is driven by the dithering clock. In addition, the image data which has been subjected to image processing in the read image processing circuit CR1 is directly outputted to the recording image processing circuit CW1, or is stored in the image memory Z3 through the compression-expansion circuit Z2.

The writing control portion CW is a portion which gives a clock signal for controlling the writing control circuit D1, while carrying out the image processing of image data. This writing control portion CW comprises the writing image processing circuit CW1 for carrying out the image processing of image data and the oscillator CW5 for generating a clock. The writing image processing circuit CW1 is a circuit for applying image processing adjusted to the characteristics of the writing section D and the engine section E to the image data, which have been read from the image memory Z3 and expanded, and outputting the data to the LD40, and it is made up of a gate array only, but it may comprise a CPU as well as a ROM, a RAM, etc. in addition to a gate array. This oscillator CW5 is a circuit for carrying out the generation of a usual clock like the above-mentioned oscillator A5. This clock is inputted to the writing image processing circuit CW1 as the driving clock for the writing image processing circuit CW1, which is driven by this clock. Moreover, this clock is inputted also to the writing control circuit D1 as the driving clock for the writing control circuit D1, which drives the LD 40, applying to it the modulation in accordance with the image data outputted from the writing image processing circuit CW1 by the clock.

The overall control board Z is a circuit board for managing the control of the whole copying machine, that is, a circuit board for carrying out the control of the sequence of the whole copying machine. This overall control board Z comprises the CPU Z1 as a control circuit for carrying out the sequence control of the whole copying machine, the compression and expansion circuit Z2 for compressing/expanding image data, the image memory Z3 for storing image data, and the clock generating device Z6 for generating a dithering clock.

This clock generating device Z6 is the same as the above-mentioned clock generating device CR6, therefore, its explanation is to be omitted. Further, the CPU Z1 functions as the sequence control circuit for carrying out the sequence control of the whole copying machine on the basis of a program stored in a ROM (not shown in the drawing), using a RAM (not shown in the drawing) as a working area. This CPU Z1 is driven by the dithering clock generated by the clock generating device Z6. The compression and expansion circuit Z2 is a gate array composed of the compressing circuit for compressing the image data read by the CCD 35 (the image data having been subjected to the image processing by the read image processing circuit CR1), and the expansion circuit for expanding the image data (compressed data) stored in the image memory Z3 to output the data to the recording image processing circuit CW1. Further, the image memory Z3 is a memory means for memorizing the image data compressed by the compression and expansion circuit Z2. These compression and expansion circuit Z2 and the image memory Z3 are driven by the dithering clock generated by the clock generating device Z6. In addition, this overall control board Z has such a structure as to carry out the giving and receiving of data with the operation section U, the I/F section V, and the engine control board C, to control the whole copying machine.

As explained in the above, in an image forming apparatus of this embodiment, the CCD control circuit B2 and the read image processing circuit CR1 are driven by the same dithering clock. This is because, if the CCD control circuit B2 and the read image processing circuit CR1 were driven by different dithering clocks respectively, the matching between the image data outputted from the CCD 35 and the image data to be subjected to the image processing could not be obtained, which would make a satisfactory image reading impossible. In addition, because this read image processing circuit CR1 performs image processing in real time during the reading by the CCD 35 in this embodiment, it can solve this problem particularly.

Further, this embodiment has a structure such that at least one control circuit (in this embodiment, the CCD control circuit B2 and the read image processing circuit CR1) is driven by a dithering clock, while the writing control circuit D1 is driven by a usual clock. This is because the writing system generally requires a high precision, and for that reason, in the case where a dithering clock is used in a usual manner, unevenness is easy to appear in writing owing to the variation of the phase of the clock, which makes it difficult to obtain a good image recording.

Further, in this embodiment, because a dithering clock is used, it is possible to reduce the intensity of the peak portion of the fundamental wave and higher harmonics of the radiation, and the countermeasure against EMI can be sufficiently taken.

Image Forming Apparatus (2)

Figure 12:
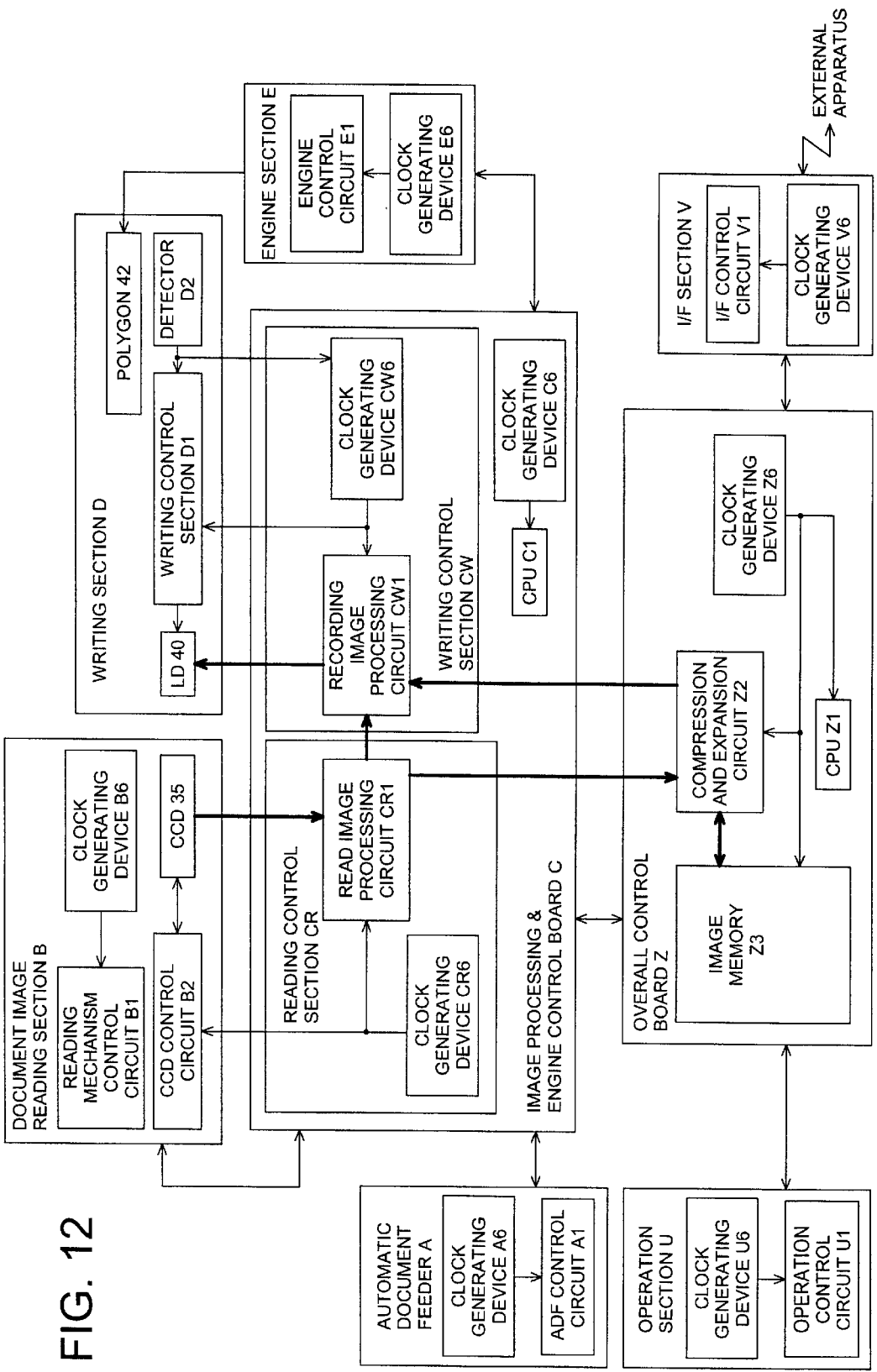
FIG. 12 is a block diagram showing the outline of the structure of the control system of an image forming apparatus according to the embodiment of this invention.

FIG. 12 is a block diagram showing the control system of the copying machine 1 in another example of the embodiment. In addition, in this example of the embodiment, the same signs are attached to the members which have basically the same structure as those in the above-mentioned example of the embodiment; in the following, they are the same as the above-mentioned example so long as a particular explanation is not given, and the explanation will be omitted.

In the above-mentioned embodiment, the two clock generating devices CR6 and Z6 are utilized, and the control circuits which are driven by the dithering clock are the CCD control circuit B2, the read image processing circuit CR1, the CPU Z1, the compression and expansion circuit Z2, and the image memory Z3 among the plural control circuits.

However, as shown in FIG. 12, this embodiment has a structure such that a dithering clock is outputted from each of the clock generating devices A6, B6, E6, U6, V6, C6, CR6, CW6, and Z6. In this way, by providing a clock generating device for generating a dithering clock in every portion, every control circuit is made to be driven by a dithering clock. Owing to this, a better countermeasure against EMI can be taken.

Incidentally, in the case where a clock generating device is provided in every portion in a simple way, various problems such that a good image recording can not be obtained, that a good image reading can not be made, and further, that matching among the various control circuits can not be obtained are produced.

Therefore, in this embodiment, assuming that the frequency deviation of the dithering clocks generated by the respective clock generating devices A6, B6, E6, U6, V6, C6, CR6, CW6, and Z6 are WA, WB, WE, WU, WV, WC, WCR, WCW, and WZ, by making the frequency deviation satisfy any one of the following inequalities, it has become possible to solve the above-mentioned problem.

WV<WCW<WCR<WA,
WV<WCW<WCR<WB,
WV<WCW<WCR<WE,
WV<WCW<WCR<WU,
WV<WCW<WCR<WC, and
WV<WCW<WCR<WZ.

That is, by making it the narrowest of all, the frequency deviation WV of the dithering clock for driving the I/F control circuit V1 which carries out the communication with an external apparatus, the occurrence of an error in the communication with the external apparatus can be suppressed, which makes it possible to secure matching with the external apparatus.

Further, by making the frequency deviation WCW of the dithering clock for driving the writing control circuit D1 which carries out writing control broader than the frequency deviation WV and narrower than the other frequency deviations (WCR, WA, WB, WE, WU, WC, and WZ), it is possible to suppress the unevenness of writing owing to the diffusion, to obtain a good image recording. Further, the frequency deviation WCR of the dithering clock for driving the CCD control circuit B2 is made broader than the frequency deviations WV and WCW and narrower than the other frequency deviations (WA, WB, WE, WU, WC, and WZ). This is based on the following reasons. That is, according to the result of the study carried out by the inventors, in the reading system, the influence of the dithering clock to the image signal appears as the variation of the storage time in reading a line of an image by the CCD 35, and the image data for each pixel are scarcely influenced by it. Further, as compared to the storage time for one line, the variation of the frequency deviation of a clock is negligibly small. On the contrary, in the writing system, the influence of the dithering clock to the image signal appears at the printing position of each pixel, and the variation of the printing position of each pixel makes a jitter, to result in lowering the image quality.

Further, this embodiment has a structure such that the output of the index signal by the detector (the index sensor) D2 is inputted also to the clock generating device CW6. The clock generating device CW6 has a structure such that resetting can be made when this index signal is inputted. That is, as described in the above, on the basis of the modulation profile, the clock generating device CW6 makes the frequency band of the basic clock signal diffuse by bringing it into the same state as that in which its frequency is modulated at specified intervals of the cycle T; however, because resetting is made in response to the index signal, diffusion can be made always to take the same way in each of the lines of main scanning, which makes it possible to carry out a good image writing. Especially, in this case, because the way of diffusion is known beforehand by the modulation profile, by applying image processing (image processing by the recording image processing circuit CW1) in accordance with this, a better image writing can be carried out.

Further, this embodiment has a structure such that a reset is applied to the clock generating device CW6 in response to the index signal; the moire, which becomes a problem in writing if the writing control circuit D1 is driven by a dithering clock without applying this reset, can be prevented by the diffusion of the dithering clock. In this case, it is necessary only to make the integral multiple of the cycle T of the modulation profile not equivalent to the time for scanning one line of the main scanning.

Image Forming Apparatus (3)

Figure 13:
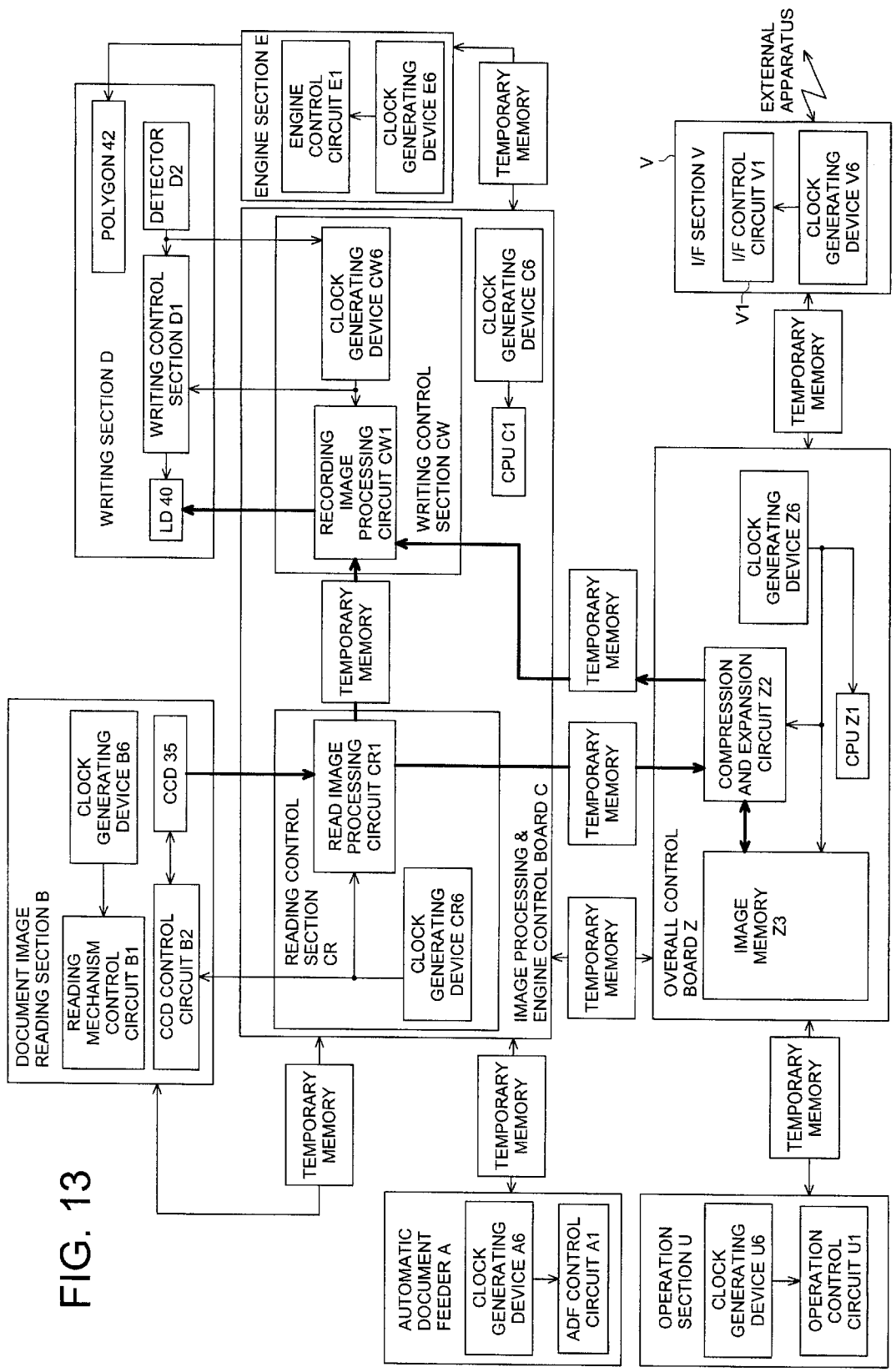
FIG. 13 is a block diagram showing the outline of the structure of the control system of an image forming apparatus according to the embodiment of this invention.

Further, as in this embodiment, in the case where a plurality of clock generating devices are used, and the frequency deviations of the dithering clocks generated by those are different from one another, a transmission error is produced in carrying out the giving and receiving of information between the control circuits. Therefore, as shown in FIG. 13, it is desirable to provide a temporary memory (such as a buffer memory) for memorizing data to be communicated on the midway of the communication line for carrying out the data communication between the control circuits. Owing to this, the giving and receiving of data can be carried out regardless of the difference in the frequency deviation, the occurrence of a transmission error can be prevented, and matching among the various control circuits can be easily made.

Further, as in this embodiment, in the case where a plurality of clock generating devices are provided in one apparatus, it happens sometimes a situation where it is desirable to make the timings of the various control circuits common to all. For that purpose, it is desirable to bring the plural clock generating devices in a synchronized condition. For the way of this synchronization, for example, it can be done by giving a reset signal to the above-mentioned plural clock generating devices which are desired to be put in synchronism with one another. In this case, it is not necessary to apply resetting to all of the plural clock generating devices, but it is necessary only to apply resetting at least to the clock generating devices which are desired to be brought in synchronism.

As described in detail in the above, according to an image forming apparatus to which a clock generating device of this invention is applied, it becomes possible that while a good image recording and image reading are carried out, matching among various control circuits is made, and a countermeasure against EMI is sufficiently taken.

As described in detail in the above, according to this invention, a clock generating device, a circuit board, an image forming apparatus, and the method of generating a clock capable of, with respect to the leading edge or the trailing edge of a clock, controlling it to come to an arbitrary position for every clock can be actualized.

What is claimed is:

1. A clock generator comprising:
   clock pulse generating means for generating a first clock pulse and a second clock pulse, wherein phases of the first clock pulse and the second clock pulse are different each other; and
   selecting means for selecting the first clock pulse and the second clock pulse in order so as to synthesize an output clock pulse from the first clock pulse and the second clock pulse within one cycle period of the output clock pulse;
   wherein the clock pulse generating means comprises:
   a base clock pulse generating section for generating a base clock pulse; and
      a clock pulse generating section for generating the first clock pulse and the second clock pulse by delaying the base clock pulse, wherein a phase of the base clock pulse is different from the phases of each of the first clock pulse and the second clock pulse.

2. The clock generator of claim 1,
   wherein the clock pulse generating means generates a third clock pulse, and a phase of the third clock pulse is different from the phases of each of the first clock pulse and the second clock pulse; and
   wherein the selecting means selects the third clock pulse so that the output clock pulse is synthesized from the first clock pulse, the second clock pulse and the third clock pulse within the one cycle period of the output clock pulse.

3. The clock generator of claim 1,
   wherein the selecting means selects the first clock pulse and the second clock pulse so that a leading edge portion of the output clock pulse comprises the first clock pulse and a trailing edge portion of the output clock pulse comprises the second clock pulse within the one cycle period of the output clock pulse.

4. The clock generator of claim 1,
   wherein the selecting means comprises a synchronism detecting section for outputting a phase difference state signal according to the base clock pulse, the first clock pulse and the second clock pulse, and
   wherein the selecting means outputs the output clock pulse synthesized from the first clock pulse and the second clock pulse according to the phase difference state signal within the one cycle period of the base clock pulse.

5. The clock generator of claim 4,
   wherein the selecting means comprises:
      a switching control section for outputting a select signal according to the base clock pulse and the phase difference state signal within the one cycle period of the base clock pulse; and
      a selecting section for outputting the output clock pulse synthesized from the first clock pulse and the second clock pulse according to the select signal within the one cycle period of the base clock pulse.

6. The clock generator of claim 5,
   wherein the switching control section outputs the select signal according to predetermined output clock information.

7. The clock generator of claim 6,
   wherein the selecting means comprises a memory and the predetermined output clock information is stored in the memory.

8. The clock generator of claim 6,
   wherein the selecting means comprises a calculator and the predetermined output clock information is calculated by the calculator.

9. The clock generator of claim 1,
   wherein the selecting means selects the first clock pulse and the second clock pulse so as to switch from the first clock pulse to the second clock pulse when the first clock pulse and the second clock pulse have a same logic.

10. The clock generator of claim 1,
    wherein the clock pulse generating section comprises a first delay element and a second delay element connected serially.

11. The clock generator of claim 1,
    wherein the clock generator comprises an integrated circuit.

12. The clock generator of claim 1,
    wherein the clock generator comprises a digital circuit.

13. A clock generator comprising:
    clock pulse generating means for generating a first clock pulse and a second clock pulse, wherein phases of the first clock pulse and the second clock pulse are different each other; and
    selecting means for selecting the first clock pulse and the second clock pulse in order so as to synthesize an output clock pulse from the first clock pulse and the second clock pulse within one cycle period of the output clock pulse;
    wherein the clock pulse generating means also generates a third clock pulse, and a phase of the third clock pulse is different from the phases of each of the first clock pulse and the second clock pulse;

wherein the selecting means selects the third clock pulse so that the output clock pulse is synthesized from the first clock pulse, the second clock pulse and the third clock pulse within the one cycle period of the output clock pulse;

wherein the selecting means selects the first clock pulse, the second clock pulse and the third clock pulse in order so that a leading edge portion of the output clock pulse comprises the first clock pulse, a trailing edge portion of the output clock pulse comprises the second clock pulse within the one cycle period of the output clock pulse, and a leading edge portion of a cycle following the one cycle period of the output clock pulse comprises the third clock pulse.

14. A method for generating an output clock pulse comprising:

generating a base clock pulse;

generating a first clock pulse and a second clock pulse by delaying the base clock pulse, wherein phases of the base clock pulse, the first clock pulse and the second clock pulse are different from each other;

selecting the first clock pulse and the second clock pulse in order so as to synthesize the output clock pulse from the first clock pulse and the second clock pulse within one cycle period of the base clock pulse.

15. A clock generator comprising:

a base clock generating section for generating a base clock pulse;

a clock pulse generating section for generating a first clock pulse and a second clock pulse by delaying the base clock pulse, wherein the base clock pulse, the first clock pulse and the second clock pulse each have different phases;

a synchronism detecting section for outputting a phase difference state signal according to the base clock pulse, the first clock pulse and the second clock pulse;

a control section for outputting output clock information;

a switching control section for outputting a select signal according to the base clock pulse, the phase difference state signal and the output clock information within one cycle period of the base clock pulse; and a selecting section for outputting an output clock pulse synthesized from the first clock pulse and the second clock pulse according to the select signal within the one cycle period of the base clock pulse;

wherein a frequency band of the output clock pulse is spread to that of the base clock pulse so that an electric field peak level of the output clock pulse is decreased.

16. The clock generator of claim 15, wherein the clock pulse generating section also generates a third clock pulse by delaying the base clock pulse, and a phase of the third clock pulse is different from the phases of each of the base clock pulse, the first clock pulse and the second clock pulse; and wherein the selecting section outputs the output clock pulse synthesized from the first clock pulse, the second clock pulse and the third clock pulse within the one cycle period of the base clock pulse.

17. The clock generator of claim 15, wherein the clock generator comprises an integrated circuit.

18. A circuit board having a clock generator, wherein the clock generator comprises:

a base clock generating section for generating a base clock pulse;

a clock pulse generating section for generating a first clock pulse and a second clock pulse by delaying the base clock pulse, wherein the base clock pulse, the first clock pulse and the second clock pulse each have different phases;

a synchronism detecting section for outputting a phase difference state signal according to the base clock pulse, the first clock pulse and the second clock pulse;

a control section for outputting output clock information;

a switching control section for outputting a select signal according to the base clock pulse, the phase difference state signal and the output clock information within one cycle period of the base clock pulse; and a selecting section for outputting an output clock pulse synthesized from the first clock pulse and the second clock pulse according to the select signal within the one cycle period of the base clock pulse;

wherein a frequency band of the output clock pulse is spread to that of the base clock pulse so that an electric field peak level of the output clock pulse is decreased.

19. An image forming apparatus having a clock generator, wherein the clock generator comprises:

a base clock generating section for generating a base clock pulse;

a clock pulse generating section for generating a first clock pulse and a second clock pulse by delaying the base clock pulse, wherein the base clock pulse, the first clock pulse and the second clock pulse each have different phases;

a synchronism detecting section for outputting a phase difference state signal according to the base clock pulse, the first clock pulse and the second clock pulse;

a control section for outputting output clock information;

a switching control section for outputting a select signal according to the base clock pulse, the phase difference state signal and the output clock information within one cycle period of the base clock pulse; and a selecting section for outputting an output clock pulse synthesized from the first clock pulse and the second clock pulse according to the select signal within the one cycle period of the base clock pulse;

wherein a frequency band of the output clock pulse is spread to that of the base clock pulse so that an electric field peak level of the output clock pulse is decreased.

20. A clock generator for generating an output clock pulse having a pulse duration, comprising:

a clock pulse generating section that generates a plurality of clock pulses each having a different phase;

a switching control section that generates a selecting signal in accordance with the pulse duration of the output clock pulse; and a selecting section that selects a first clock pulse and a second clock pulse from the plurality of clock pulses in accordance with the selecting signal in a manner such that: (i) a fore half of the first clock pulse including a leading edge portion is outputted as the output clock pulse, (ii) the output clock pulse is switched from the fore half of the first clock pulse to a latter half of the second pulse within the pulse duration of the output clock pulse, and (iii) the latter half of the second clock pulse including a trailing edge portion is outputted as the output clock pulse.

21. The clock generator of claim 20, wherein the selecting section comprises a synchronism detecting section that outputs a phase difference state signal according to a base clock pulse, the first clock pulse and the second clock pulse; and wherein the selecting section outputs the output clock pulse synthesized from the first clock pulse and the second clock pulse according to the phase difference state signal within one cycle period of the base clock pulse.

22. The clock generator of claim 21, wherein the switching control section outputs the selecting signal based on the base clock pulse and the phase difference state signal within the one cycle period of the base clock pulse; and wherein the selecting section outputs the output clock pulse synthesized from the first clock pulse and the second clock pulse according to the selecting signal within the one cycle period of the base clock pulse.

23. The clock generator of claim 22, wherein the switching control section outputs the selecting signal according to predetermined output clock information.

24. The clock generator of claim 23, wherein the selecting section comprises a memory and the predetermined output clock information is stored in the memory.

25. The clock generator of claim 23, wherein the selecting section comprises a calculator and the predetermined output clock information is calculated by the calculator.

26. The clock generator of claim 20, wherein the selecting section selects the first clock pulse and the second clock pulse so as to switch from the first clock pulse to the second clock pulse when the first clock pulse and the second clock pulse have a same logic.

27. The clock generator of claim 20, wherein the clock pulse generating section comprises a first delay element and a second delay element connected serially.

28. The clock generator of claim 20, wherein the clock generator comprises an integrated circuit.

29. The clock generator of claim 20, wherein the clock generator comprises a digital circuit.

* * * * *